United States Patent [19]

Reutling et al.

[11] 4,074,421
[45] Feb. 21, 1978

[54] METHOD AND APPARATUS FOR CONNECTING CONDUCTORS TO TERMINALS OF AN APPARATUS

[75] Inventors: Rolf Torgny Reutling, Stockholm; Nils Anders Rune Thysk, Skarholmen, both of Sweden

[73] Assignee: Telefonaktiebolaget L M Ericsson, Stockholm, Sweden

[21] Appl. No.: 723,446

[22] Filed: Sept. 15, 1976

[30] Foreign Application Priority Data

Oct. 17, 1975 Sweden .............................. 7511665

[51] Int. Cl.² ............................................ H01R 43/00
[52] U.S. Cl. ...................... 29/628; 29/33 K; 29/33 M; 29/748; 29/760; 228/5.1; 228/904
[58] Field of Search .............. 29/628, 748, 760, 33 K, 29/33 M, 739, 753, 761; 228/5.1, 4.5, 904

[56] References Cited

U.S. PATENT DOCUMENTS

| 3,239,855 | 3/1966 | Lhomme et al. ................... 29/748 X |
| 3,253,324 | 5/1966 | Frey et al. .......................... 29/628 X |
| 3,646,572 | 2/1972 | Burr ..................................... 29/628 X |
| 3,664,016 | 5/1972 | Sevc et al. ......................... 29/760 X |
| 3,861,033 | 1/1975 | Updyke ................................ 29/628 |

FOREIGN PATENT DOCUMENTS

| 218,542 | 1/1957 | Australia .............................. 29/628 |
| 1,804,961 | 11/1970 | Germany ............................. 29/628 |

OTHER PUBLICATIONS

"Opposed Lead Forming", IBM Technical Disclosure Bulletin, vol. 15, No. 11 (Apr. 1973).

Primary Examiner—Victor A. DiPalma
Attorney, Agent, or Firm—Hane, Roberts, Spiecens & Cohen

[57] ABSTRACT

A method of connecting an isolated electric conductor to terminals of an apparatus where the electric conductor is drawn onto a fixture provided with holes arranged in correspondence with the terminals of the apparatus, from hole to hole and formed into loops through at least some of the holes. Then the terminals of the apparatus are inserted through the holes of the fixture and brought to contact against the inside of the loops where they are then attached.

7 Claims, 3 Drawing Figures

METHOD AND APPARATUS FOR CONNECTING CONDUCTORS TO TERMINALS OF AN APPARATUS

BACKGROUND OF THE INVENTION

The present invention relates to a method of connecting an isolated electric conductor to terminals of an apparatus and a device for executing the method.

In connection with irregular thread connection of tag fields of apparatuses, at present two principle methods are used.

In one method, the connection thread is laid out on a template by means of pins on the template to a pattern which is similar to the one of the completed cable. After the converging thread bunches are tied together, the cable is cut away from the pins and moved to the apparatus where the different threads are connected to respective tags in the apparatus.

In the other method, one works in the tag field of the apparatus and lays out the connection thread directly from tag to tag in the apparatus and connects it to respective tags successively. One then follow determined routes passing the intermediate tags.

Both these methods may be executed manually or entirely or partly mechanically. They have, however, drawbacks, especially those concerned with the possibilities of mechanization. The first mentioned method has the drawback that the position for the connection tag to which a certain thread end is to be connected has to be identified twice, on one hand at the laying of the connection thread on the template and on the other hand after the transfer to the apparatus at the connection of the thread to the connection tag of the apparatus. Furthermore, only the thread laying is suitable for mechanization. In large tight connection fields, moreover, the possibilities to place separate template pins for each thread end are, from considerations of space, very limited. The last mentioned method has the drawback that at mechanical connection it is required that the connection tags of the apparatus be placed with the precision which the machine requires. This type of connection is often used at the connection of notch tags from apparatuses containing circuit cards. The tag fields of these apparatuses are regular and often include a ground plane or screen plane along which the connection thread ought to be laid. With known methods such as "wire-wrap" and "termi-point", such laying of the connection thread cannot be achieved, but the thread lies with varying height from the screen plane.

The purpose of the present invention is to eliminate the above-mentioned drawbacks.

BRIEF DESCRIPTION OF THE DRAWING

The invention will be described in detail in connection the enclosed drawings, where schematically FIG. 2 shows a fastening part (fixture + plate) of the apparatus according to FIG. 1 and the apparatus with its tags, while

DETAILED DESCRIPTION OF THE INVENTION

The method according to the invention means laying an isolated electric conductor on a fixture or on a plate, which can be a ground plate for the apparatus of the connection tags of which the conductor is to be connected. The fixture and the plate are provided with holes arranged in correspondence with the tags of the apparatus. The conductor is drawn directly from hole to hole during a successive pressing down of the conductor in the holes in question in order to form loops, whereby the holes where the conductor is not pressed down are not covered by the conductor. When the conductor is inserted in all of the holes in question, the apparatus is mounted in such a manner that all of the connection tags of the apparatus protrude through the holes of the fixture/plate and are brought to bear against the inner side of the loops drawn through the holes. After that, the ends of the tags are fastened to the ends of the loops, as, for example, by means of soldering.

In the case only one fixture with holes is used, the fixture is removed and the connections of the apparatus are ready.

In case a fixture with holes and a ground plate with holes which belongs to the apparatus are used, the fixture is removed when the conductor has been laid between the holes and formed into loops in the holes, after which the apparatus tags are stuck projected through the holes of the ground plate and are fastened at the loop. This may have a certain drawback in that the conductor will be between the ground plate and the rest of the apparatus, which can complicate possible changes in the connection since only the loop ends of the conductor are within reach. This drawback is eliminated by means of a special plate parallel with the fixture and provided with similar holes as the fixture. In this connection, when the conductor is laid out and the tags of the apparatus are projected through the holes of the plate and the fixture, the fixture is removed, the ends of the tags are fastened at the ends of the loops, and the special plate is removed.

According to the described manner, the conductor is to be laid between the predetermined holes in routes so that intermediate holes are not covered and is successively formed into loops in the holes. This is made easier if the fixture is provided with tubes or pipes going through the holes which reach through the holes of the ground plate where there are such.

Figure 1:
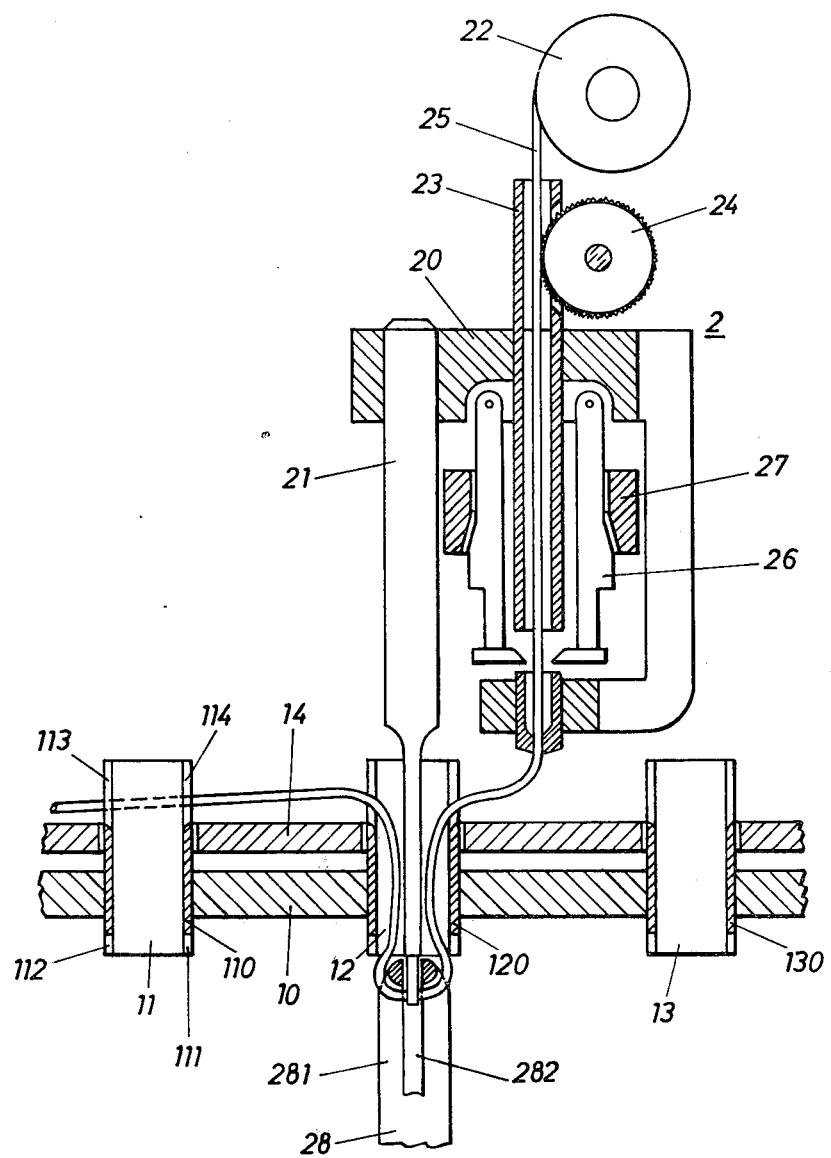
FIG. 1 shows an apparatus for connecting the conductor to the tag of an apparatus.

The apparatus according to FIG. 1 comprises a stationary fixture 10 with a number of holes of which three are shown and mentioned 11, 12, 13; plate 14 with corresponding holes; and a movable part 2 which consists of a fundament 20; a cutter 21 which may be raised and lowered, a storage reel 22 for conducting material 25, a tube 23 and toothed wheel 24 for transport of conductor 25 near to the point of the cutter 21; a cutting means 26 which can be actuated by a conic ring 27; and a forked means 28 for extension of the end of a loop.

At the position shown in FIG. 1, a conductor 25 has been drawn past the hole 11 and then down with a loop in the hole 12, where the two branches 281 and 282 of the fork means 28 with its points have been brought on each side of the cutter 21 at a more narrow part at the end of the cutter, whereby the end of the loop has been expanded perpendicular to the length direction of the hole to a dimension exceeding the diameter of the hole 12. The fixture 10 has in its holes pipes 110, 120 and 130 which in both ends have diametrically situated slits extending in the length direction of the tubes. These slits are, for the hole 11 as an example denoted 111, 112, 113, 114. When drawing the conductor, the movable part 2 is brought so that the conductor will be placed across the hole through two diametrically placed slits, whereupon the cutter 21 is brought straight over the hole and then lowered through the hole bringing the conductor through the hole so that a loop is formed. With the cutter 21 in the lowest position, the fork means 28 is brought forward and passes the end of the cutter, the end of the loop being extended in the slits of the tube. When the means 28 is brought back and the cutter after that is brought straight upwards, the loop does not follow. The movable part 2 is removed to the next hole and the procedure is repeated.

Figure 2:
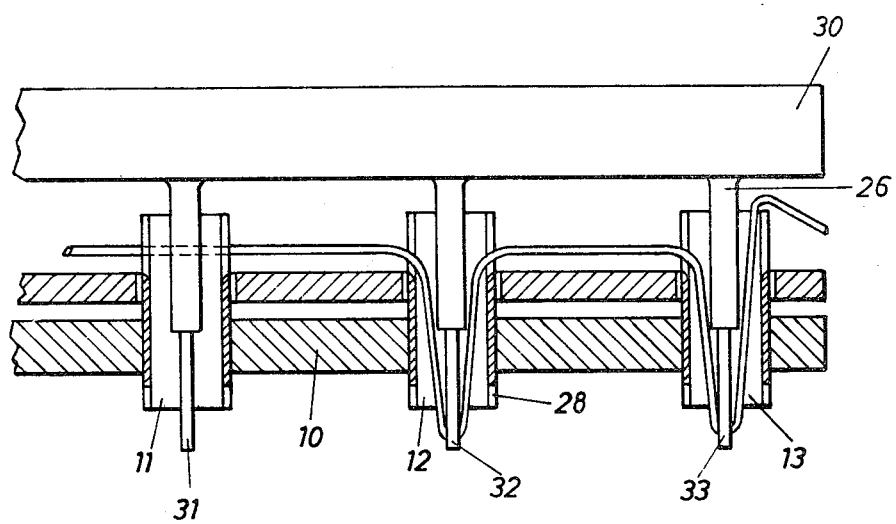
Figure 3:
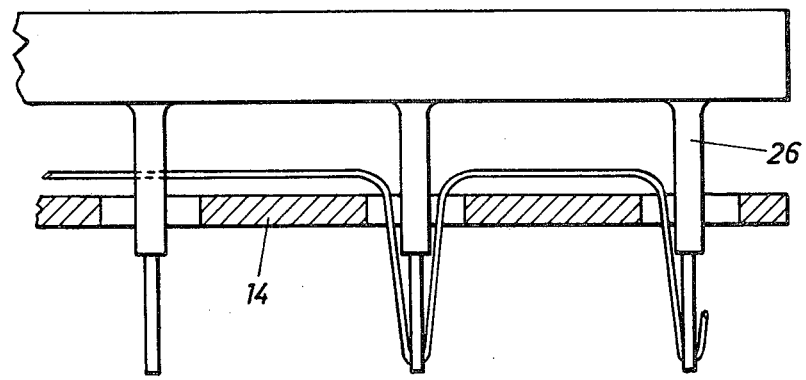
FIG. 3 shows a part of the fastened part (plate) and the apparatus with its tags.

After the conductor 25 has been laid in a loop through all the holes in question, the ring 27 is sunk lowered whereby the cutting means 26 cuts off the conductor. The movable part 2 is brought away and the apparatus 30 in question is brought with its tags 31, 32, 33 (see FIG. 2) through the holes 11, 12, 13. In the holes 12 and 13, the ends of the tags hit the ends of the loops. The loops are fastened around the tag, whereby they come loose from the slits. After that, the fixture 10 is removed, and the tags are soldered on the loops (see FIG. 3). The auxiliary plate 14 can now be removed, or possibly follow the apparatus, and in this connection serve as a conductor cover or ground plane, respectively.

We claim:

1. A method of connecting an isolated electrical conductor to terminal tags of an apparatus in which a fixture having a series of holes formed therethrough is provided which series of holes is patterned in correspondence with the tags of the apparatus, comprising: advancing the electrical conductor to a first one of said series of holes of said fixture; repeatedly advancing said electrical conductor to the other of said series of holes, one after another; forming a loop through at least some of said series of holes after said electrical conductor has been advanced to the respective hole in which the loop is to be formed; thereafter inserting the tags of the apparatus through said series of holes which correspond therewith until the ends of said tags bear against the inner portions of said loops; and then joining said tag ends to the inner portions of said loops for permanent fastening.

2. The method according to claim 1, wherein said step of forming a loop through at least some of said series of holes comprises extending the bottom of the loop completely past its respective hole and extending said bottom of the loop in a direction perpendicular to the lengthwise direction of the hole such that it extends beyond the diameter of the hole, whereby the loop is held in place thereby.

3. The method according to claim 2, wherein said step of joining said tag ends to the inner portions of said loops comprises soldering said tag ends to said inner portions of said loops.

4. An apparatus for connecting an isolated electrical conductor to terminal tags of a device, comprising: a fixture having a series of holes formed therein, said series of holes being patterned after said terminal tags of the device; storage means for storing said electrical conductor situated above said fixture; a cutter mounted for reciprocal movement toward and away from said fixture so that when said electrical conductor is advanced to said series of holes said cutter in its downward position will form loops in at least some of said holes, said cutter having an end nearest said fixture which is of narrower width than the rest of said cutter; carriage means mounting said storage means and said cutter for movement along said fixture to lay said electrical conductor above said holes; and fork means positioned below said fixture also mounted on said carriage means mounting said storage means and said cutter, said fork means having a first leg and a second leg which define therebetween a space of greater dimension than the width of said end of said cutter, said fork means expanding the bottom of each loop formed in a hole in a direction transverse to the lengthwise direction of the hole so that the bottom portion of the loop is of greater dimension than the diameter of the hole whereby the loop is held in the hole.

5. The apparatus according to claim 4, further comprising means for cutting off said electrical conductor after said series of holes have been passed over by said electrical conductor, said means for cutting off being mounted on said carriage means between said storage means and said fixture.

6. The apparatus according to claim 5, wherein said carriage means comprises means for advancing said electrical conductor as said carriage means is moved along said series of holes.

7. The apparatus according to claim 4, further comprising a plate parallel with said fixture and also comprising a series of holes in the same pattern as said series of holes of said fixture, and a series of tubes, each tube connecting a hole of said plate with a corresponding hole of said fixture, whereby the fixture and the plate are secured together.

* * * * *